US011681023B2

(12) United States Patent
Wagner et al.

(10) Patent No.: US 11,681,023 B2
(45) Date of Patent: Jun. 20, 2023

(54) LIDAR SYSTEM WITH VARIED DETECTION SENSITIVITY BASED ON LAPSED TIME SINCE LIGHT EMISSION

(71) Applicant: Continental Automotive Systems, Inc., Auburn Hills, MI (US)

(72) Inventors: Horst Wagner, Santa Barbara, CA (US); Min Ren, Santa Barbara, CA (US)

(73) Assignee: Continental Autonomous Mobility US, LLC, Auburn Hills, MI (US)

( * ) Notice: Subject to any disclaimer, the term of this patent is extended or adjusted under 35 U.S.C. 154(b) by 221 days.

(21) Appl. No.: 16/903,927

(22) Filed: Jun. 17, 2020

(65) Prior Publication Data

US 2021/0396855 A1 Dec. 23, 2021

(51) Int. Cl.
*G01S 17/88* (2006.01)
*G01S 7/4863* (2020.01)
*G01S 17/931* (2020.01)
*G01S 7/486* (2020.01)
*H01L 31/107* (2006.01)

(52) U.S. Cl.
CPC .......... *G01S 7/4863* (2013.01); *G01S 7/4868* (2013.01); *G01S 17/931* (2020.01); *H01L 31/107* (2013.01)

(58) Field of Classification Search
CPC .......... G01S 17/88; G01S 17/89; G01S 7/003; G01S 7/48; H01L 31/107
USPC .............................................. 250/221, 214 R
See application file for complete search history.

(56) References Cited

U.S. PATENT DOCUMENTS

| 5,581,094 A * | 12/1996 | Hara | G01S 7/4816 257/233 |
|---|---|---|---|
| 2011/0188029 A1 | 8/2011 | Schmitt | |
| 2017/0307738 A1 | 10/2017 | Schwarz et al. | |
| 2018/0180473 A1 | 6/2018 | Clemens et al. | |
| 2018/0299552 A1 | 10/2018 | Shu et al. | |
| 2019/0310354 A1 | 10/2019 | Li et al. | |
| 2020/0049821 A1 | 2/2020 | LaChapelle | |
| 2021/0311174 A1 | 10/2021 | Jiang | |
| 2021/0349192 A1 | 11/2021 | Wang | |

OTHER PUBLICATIONS

International Search Report and the Written Opinion of the International Searching Authority dated Oct. 13, 2021 for the counterpart PCT Application No. PCT/US2021/070722.
Non-Final Office Action dated Sep. 23, 2022 from related U.S. Appl. No. 16/904,639.
International Preliminary Report on Patentability and Written Opinion dated Jun. 18, 2020 from related International patent application No. PCT/US2021/070730.

\* cited by examiner

*Primary Examiner* — Que Tan Le (57) ABSTRACT

A Lidar system includes a light emitter and an array of photodetectors. The Lidar system includes a computer having a processor and a memory storing instructions executable by the processor to actuate the light emitter to output a series of shots. The instructions include instructions to provide a first bias voltage to the photodetectors for a first period of time after the light emitter emits a first subset of the series of shots. The instructions includes instructions to provide a second bias voltage to at least one of the photodetectors for a second period of time after the light emitter emits a second subset of the series of shots, the second bias voltage greater that the first bias voltage, the second subset of shots emitted after the first subset of the series of shots.

18 Claims, 7 Drawing Sheets

FIG. 7 ary when detecting near objects. Increasing the bias voltages as a function of time reduces dead time in which the photodetectors 14 have inhibited detection abilities (such as during quenching a SPAD, as further described below), e.g., by providing the bias voltage below a breakdown voltage of the photodetector 14 when the time is relatively low (when the emitted light is reflected of something relatively close and has a relatively high return intensity) and by providing the bias voltage above the breakdown voltage of the photodetector 14 when the time is relatively high (when the emitted light is reflected of something relatively far and has a relatively low return intensity).

LIDAR SYSTEM WITH VARIED DETECTION SENSITIVITY BASED ON LAPSED TIME SINCE LIGHT EMISSION

BACKGROUND

A Lidar system includes a photodetector, or an array of photodetectors. Light is emitted into a field of view of the photodetector. The photodetector detects light that is reflected by an object in the field of view. For example, a flash Lidar system emits pulses of light, e.g., laser light, into essentially the entire the field of view. The detection of reflected light is used to generate a 3D environmental map of the surrounding environment. The time of flight of the reflected photon detected by the photodetector is used to determine the distance of the object that reflected the light.

The Lidar system may be mounted on a vehicle to detect objects in the environment surrounding the vehicle and to detect distances of those objects for environmental mapping. The output of the Lidar system may be used, for example, to autonomously or semi-autonomously control operation of the vehicle, e.g., propulsion, braking, steering, etc. Specifically, the system may be a component of or in communication with an advanced driver-assistance system (ADAS) of the vehicle.

Some applications, e.g., in a vehicle, include several Lidar systems. For example, the multiple system may be aimed in different directions and/or may detect light at different distance ranges, e.g., a short range and a long range.

DETAILED DESCRIPTION

With reference to FIGS. 1-5, wherein like numerals indicate like parts, a Lidar system 10 is shown. The Lidar system 10 includes a light emitter 12. The Lidar system 10 includes an array of photodetectors 14. The Lidar system 10 includes a computer 16 having a processor and a memory storing instructions executable by the processor to actuate the light emitter 12 to output a shot, i.e., a pulse of light. The instructions include instructions to provide a bias voltage to one or more of the photodetectors 14 after actuating the light emitter 12. The instructions include instructions to increase the bias voltage as a function of time lapsed since actuating the light emitter 12.

Increasing the bias voltage provided to the photodetectors 14 as a function of time lapsed since actuating the light emitter 12 enables the Lidar system 10 to have varied detection sensitivity for various detection distances, e.g., without necessarily changing an intensity of the shots. In other words, the increasing bias voltage enables effective detection of relatively near and far objects, e.g., by having a higher gain for increased probability of detection of far objects and lower gain for increased resolution and/or accuracy when detecting near objects. Increasing the bias voltages as a function of time reduces dead time in which the photodetectors 14 have inhibited detection abilities (such as during quenching a SPAD, as further described below), e.g., by providing the bias voltage below a breakdown voltage of the photodetector 14 when the time is relatively low (when the emitted light is reflected of something relatively close and has a relatively high return intensity) and by providing the bias voltage above the breakdown voltage of the photodetector 14 when the time is relatively high (when the emitted light is reflected of something relatively far and has a relatively low return intensity).

Figure 1:
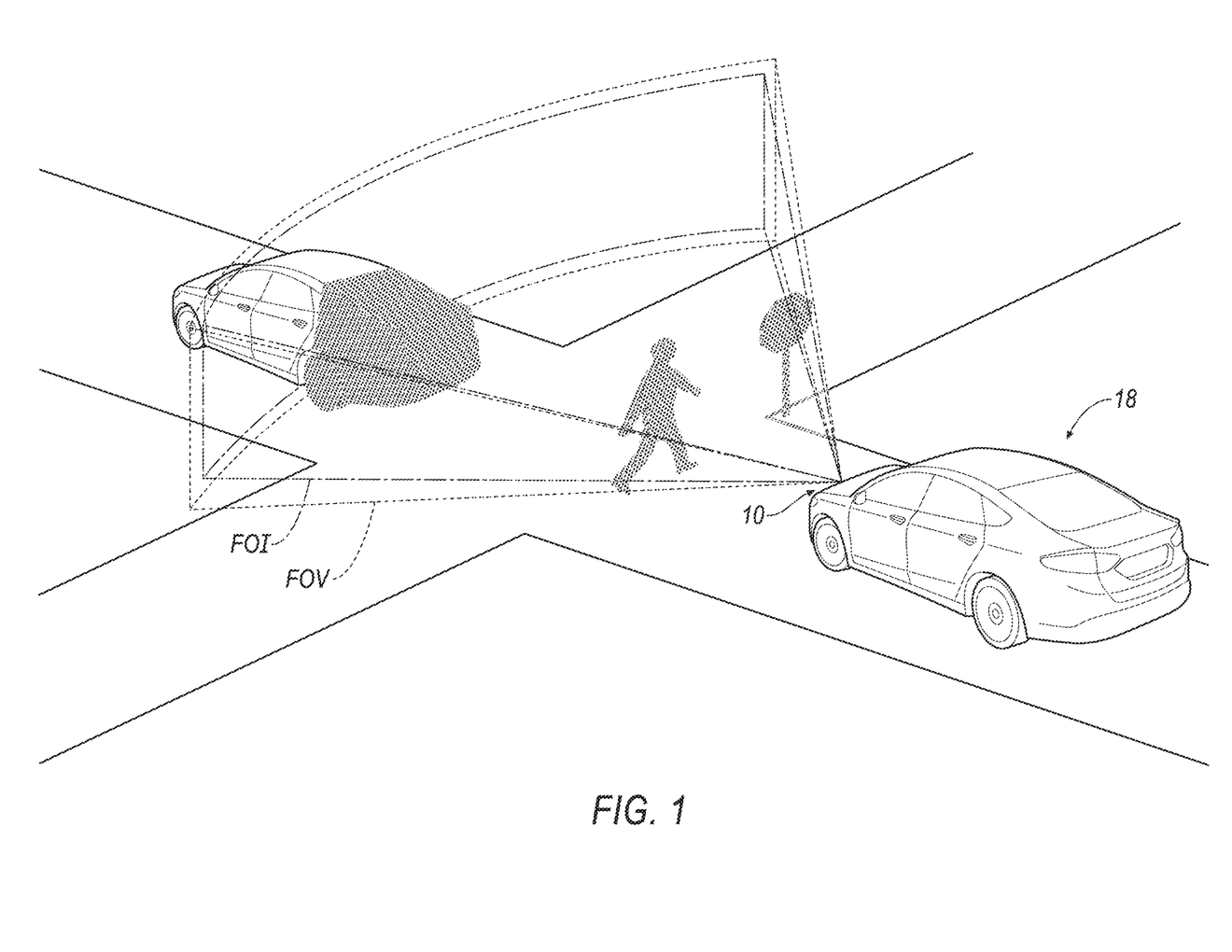
FIG. 1 is a perspective view of a vehicle having a Lidar system.
Figure 2:
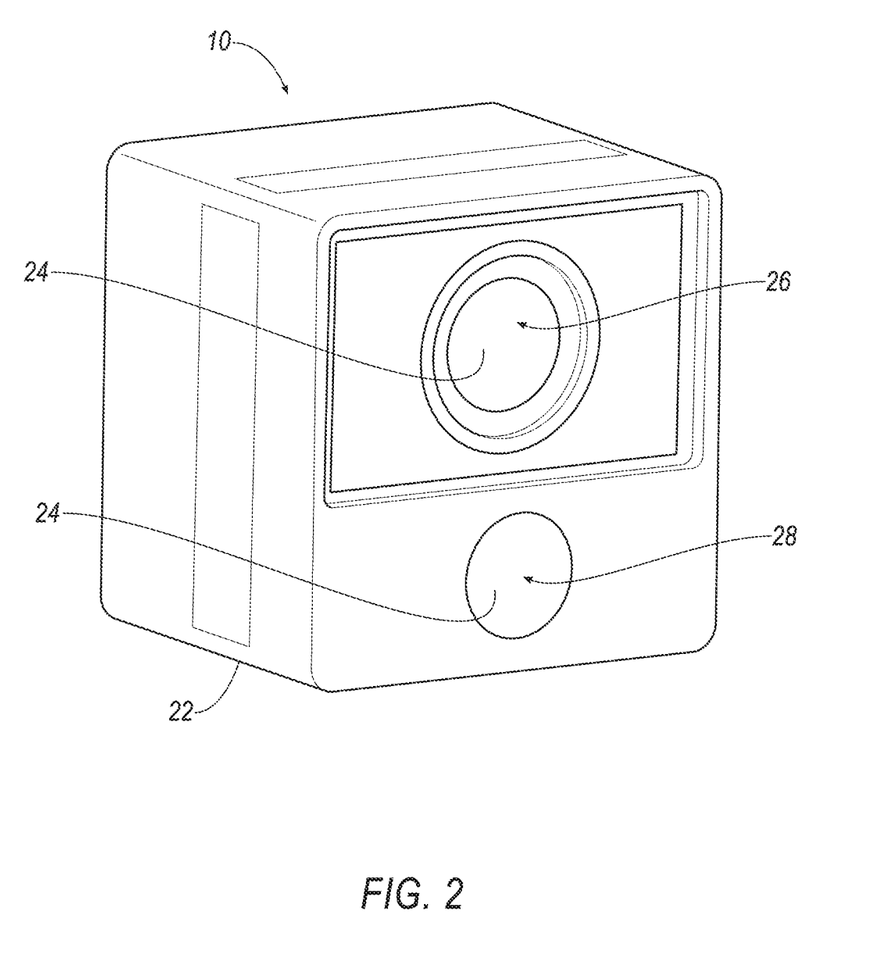
FIG. 2 is a perspective view of the Lidar system.

FIG. 1 shows an example vehicle 18. The Lidar system 10 is mounted to the vehicle 18. In such an example, the Lidar system 10 is operated to detect objects in the environment surrounding the vehicle 18 and to detect distances of those objects for environmental mapping. The output of the Lidar system 10 may be used, for example, to autonomously or semi-autonomously control the operation of the vehicle 18, e.g., propulsion, braking, steering, etc. Specifically, the Lidar system 10 may be a component of or in communication with an advanced driver-assistance system (ADAS) 20 of the vehicle 18. The Lidar system 10 may be mounted on the vehicle 18 in any suitable position and aimed in any suitable direction. As one example, the Lidar system 10 is shown on the front of the vehicle 18 and directed forward. The vehicle 18 may have more than one Lidar system 10 and/or the vehicle 18 may include other object detection systems, including other Lidar systems 10. The vehicle 18 is shown in FIG. 1 as including a single Lidar system 10 aimed in a forward direction merely as an example. The vehicle 18 shown in the Figures is a passenger automobile. As other examples, the vehicle 18 may be of any suitable manned or un-manned type including a plane, satellite, drone, watercraft, etc.

The Lidar system 10, illustrated in FIGS. 1-5, may be a solid-state Lidar system. In such an example, the Lidar system 10 is stationary relative to the vehicle 18. For example, the Lidar system 10 may include a casing 22 (shown in FIG. 2 and described below) that is fixed relative to the vehicle 18, i.e., does not move relative to the component of the vehicle 18 to which the casing 22 is attached, and a silicon substrate of the Lidar system 10 is supported by the casing 22.

As a solid-state Lidar system, the Lidar system 10 may be a flash Lidar system. In such an example, the Lidar system 10 emits pulses (shots) of light into the field of illumination FOI. More specifically, the Lidar system 10 may be a 3D flash Lidar system that generates a 3D environmental map of the surrounding environment, as shown in part in FIG. 1. An example of a compilation of the data into a 3D environmental map is shown in the FOV and the field of illumination (FOI) in FIG. 1. A 3D environmental map may include location coordinates of points within the FOV with respect to a coordinate system, e.g., a Cartesian coordinate system with an origin at a predetermined location such as a GPS (Global Positioning System) reference location, or a reference point within the vehicle 18, e.g., a point where a longitudinal axis and a lateral axis of the vehicle 18 intersect.

In such an example, the Lidar system 10 is a unit. A Lidar system 10 may include a casing 22, an outer optical facia 24, a light receiving system 26, and a light emitting system 28. A focal-plane array (FPA 30) 30 is a component of the light receiving system 26 of the Lidar system 10 as discussed below with respect to FIGS. 3-5.

The casing 22, for example, may be plastic or metal and may protect the other components of the Lidar system 10 from environmental precipitation, dust, etc. In the alternative to the Lidar system 10 being a unit, components of the Lidar system 10, e.g., the light emitting system 28 and the light receiving system 26, may be separate and disposed at different locations of the vehicle 18. The Lidar system 10 may include mechanical attachment features to attach the casing 22 to the vehicle 18 and may include electronic connections to connect to and communicate with electronic system of the vehicle 18, e.g., components of the ADAS 20.

The outer optical facia 24 (which may be referred to as a "window") allows light to pass through, e.g., light generated by the light emitting system 28 exits the Lidar system 10 and/or light from environment enters the Lidar system 10. The outer optical facia 24 protects an interior of the Lidar system 10 from environmental conditions such as dust, dirt, water, etc. An outer optical facia 24 is typically formed of a transparent or semi-transparent material, e.g., glass, plastic. An outer optical facia 24 may extend from the casing 22 and/or may be attached to the casing 22.

The Lidar system 10 includes the light emitter 12 that emits shots, i.e., pulses, of light into the field of illumination FOI for detection by the light receiving system 26 when the light is reflected by an object in the field of view FOV. The light receiving system 26 has a field of view (hereinafter "FOV") that overlaps the field of illumination FOI and receives light reflected by surfaces of objects, buildings, road, etc., in the FOV. The light emitter 12 may be in electrical communication with the computer 16, e.g., to provide the shots in response to commands from the computer 16.

The light emitting system 28 may include one or more light emitter 12 and optical components such as a lens package 32, lens crystal 34, pump delivery optics 38, etc. The optical components, e.g., lens package 32, lens crystal 34, etc., may be between the light emitter 12 on a back end of the casing 22 and the outer optical facia 24 on a front end of the casing 22. Thus, light emitted from the light emitter 12 passes through the optical components before exiting the casing 22 through the outer optical facia 24.

Figure 3:
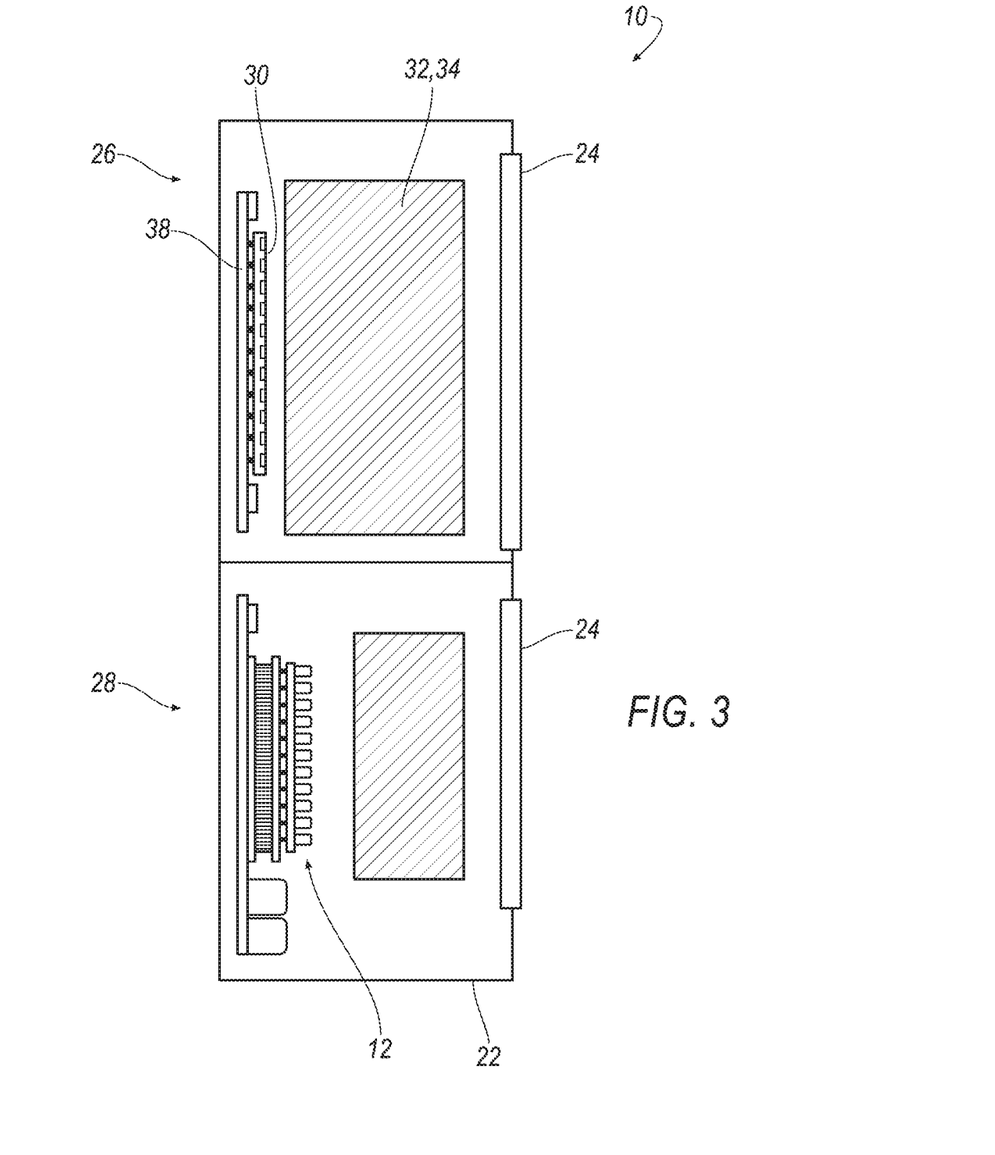
FIG. 3 is a cross section of the Lidar system.
Figure 4:
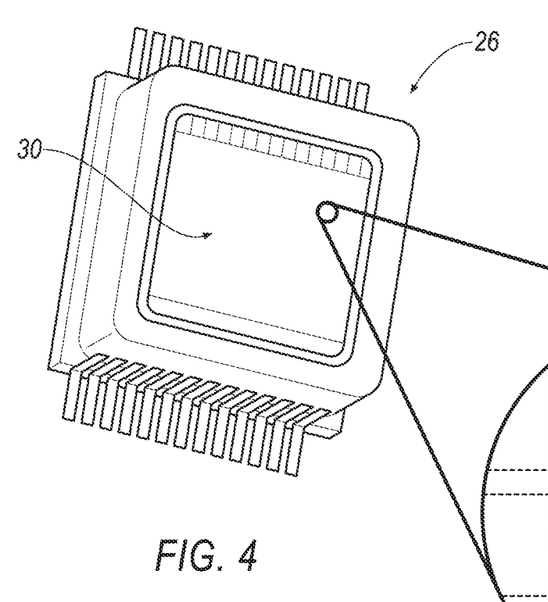
FIG. 4 is a perspective view of components of a light-receiving system of the Lidar system.
Figure 4A:
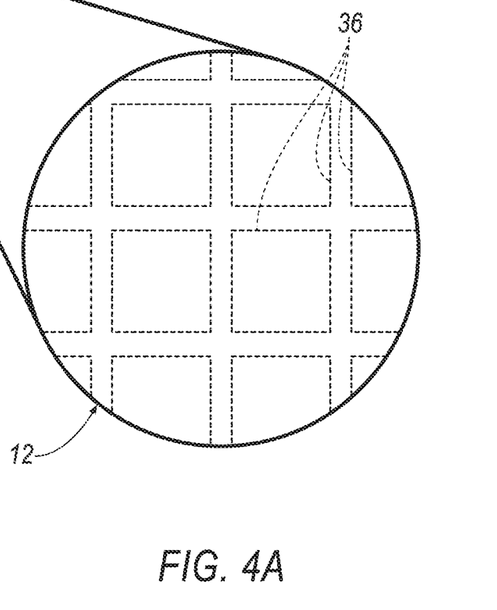
FIG. 4A is an enlarged illustration of a portion of FIG. 4.
Figure 5:
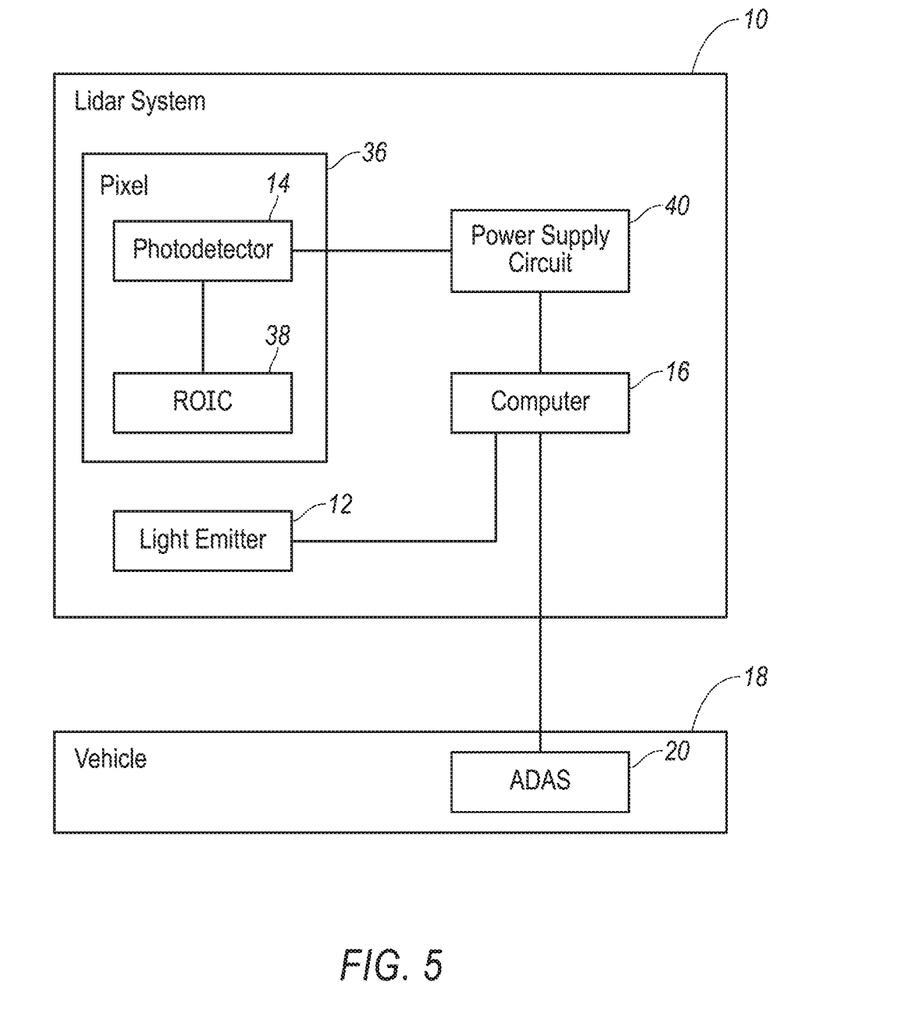
FIG. 5 is a block diagram of components of the vehicle and the Lidar system.

The light emitter 12 may be a semiconductor light emitter 12, e.g., laser diodes. In one example, as shown in FIG. 3, the light emitter 12 may include a vertical-cavity surface-emitting laser (VCSEL) emitter. As another example, the light emitter 12 may include a diode-pumped solid-state laser (DPSSL) emitter. As another example, the light emitter 12 may include an edge emitting laser emitter. The light emitter 12 may be designed to emit a pulsed flash of light, e.g., a pulsed laser light. Specifically, the light emitter 12, e.g., the VCSEL or DPSSL or edge emitter, is designed to emit a pulsed laser light. Each pulsed flash of light may be referred to as the "shot" as used herein. The light emitted by the light emitter 12 may be infrared light. Alternatively, the light emitted by the light emitter 12 may be of any suitable wavelength. The Lidar system 10 may include any suitable number of light emitters 12. In examples that include more than one light emitter 12, the light emitters 12 may be identical or different.

Figure 6:
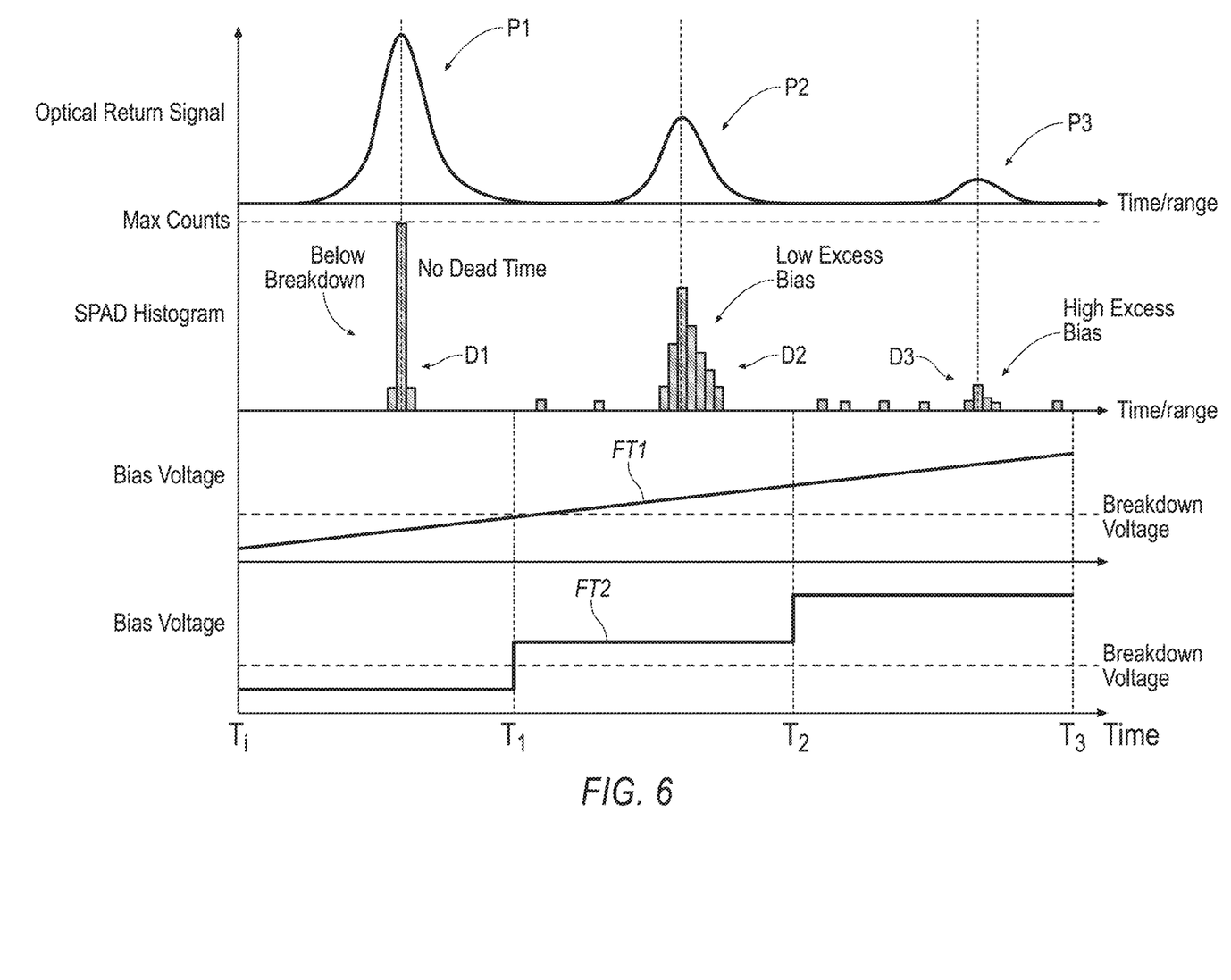
FIG. 6 is an illustration of strength of an example optical return signal with respect to time of flight of emitted light, detection of the emitted light by a photodetector at various bias voltages, and voltage functions that provide bias voltages with respect to time.

Light emitted by the light emitter 12 may be reflected off an object back to the Lidar system 10 and detected by the photodetectors 14. An optical signal strength of the returning light may be, at least in part, proportional to a time of flight/distance between the Lidar system 10 and the object reflecting the light. The optical signal strength may be, for example, an amount of photons that are reflected back to the Lidar system 10 from one of the shots of pulsed light. The greater the distance to the object reflecting the light/the greater the flight time of the light, the lower the strength of the optical return signal, e.g., for shots of pulsed light emitted at a common intensity. For example, and with reference to FIG. 6, a graph of the strength of the optical return signal with respect to the distance to the object reflecting the light/the flight time of the light is illustrated. In FIG. 6, increased height from a horizontal axis indicates increased optical signal strength, and increased distance to the right of a vertical axis indicates increased distance to the object reflecting the light/increased flight time of the light. For example, a peak P1 indicates light that is reflected off a relatively close object that returns with a relatively high optical signal strength. As another example, a peak P2 indicates light that is reflected off a relatively mid-range object that returns with a relatively mid-range optical signal strength. As another example, a peak P3 indicates light that is reflected off a relatively far object that returns with a relatively low optical signal strength. Apexes of the peaks P1, P2, P3 indicates a return time of the reflected light. The reflected light indicated by the peaks P1, P2, P3 may be from a single shot of pulsed of light emitted by the light emitter 12 that is reflected by multiple objects at varying distances in the FOI and/or from multiple shots of pulsed of light from the light emitter 12.

The light receiving system 26 detects light, e.g., emitted by the light emitter 12. The light receiving system 26 may include the focal-plane array (FPA 30) 30. The FPA 30 can include an array of pixels 36. Each pixel 36 can include one of the photodetectors 14 and a read-out circuit (ROIC 38). A power-supply circuit 40 may power the pixels 36. The FPA 30 may include a single power-supply circuit 40 in communication with all photodetectors 14 or may include a plurality of power-supply circuits 40 in communication with a group of the photodetectors 14. The light receiving system 26 may include receiving optics such as the lens package 32. The receiving optics may be between the receiving outer optical facia 24 and the FPA 30.

The FPA 30 detects photons by photo-excitation of electric carriers, e.g., with the photodetectors 14. An output from the FPA 30 indicates a detection of light and may be proportional to the amount of detected light. The outputs of FPA 30 are collected to generate a 3D environmental map, e.g., 3D location coordinates of objects and surfaces within FOV of the Lidar system 10. The FPA 30 may include the photodetectors 14, e.g., that include semiconductor components for detecting laser and/or infrared reflections from the FOV of the Lidar system 10. The photodetectors 14, may be, e.g., photodiodes (i.e., a semiconductor device having a p-n junction or a p-i-n junction) including avalanche photodetectors, metal-semiconductor-metal photodetectors 14, phototransistors, photoconductive detectors, phototubes, photomultipliers, etc. Optical elements such as the lens package 32 of the light receiving system 26 may be positioned between the FPA 30 in the back end of the casing 22 and the outer optical facia 24 on the front end of the casing 22.

The ROIC 38 converts an electrical signal received from photodetectors 14 of the FPA 30 to digital signals. The ROIC 38 may include electrical components which can convert electrical voltage to digital data. The ROIC 38 may be connected to the computer 16, which receives the data from the ROIC 38 and may generate 3D environmental map based on the data received from the ROIC 38.

The pixel 36 functions to output a single signal or stream of signals corresponding to a count of photons incident on the pixel 36 within one or more sampling periods. Each sampling period may be picoseconds, nanoseconds, microseconds, or milliseconds in duration. The pixel 36 can output a count of incident photons, a time between incident photons, a time of incident photons (e.g., relative to an illumination output time), or other relevant data, and the Lidar system 10 can transform these data into distances from the system to external surfaces in the fields of view of these pixels 36. By merging these distances with the position of pixels 36 at which these data originated and relative positions of these pixels 36 at a time that these data were collected, the computer 16 (or other device accessing these data) can reconstruct a three-dimensional 3D (virtual or mathematical) model of a space within FOV, such as in the form of 3D image represented by a rectangular matrix of range values, wherein each range value in the matrix corresponds to a polar coordinate in 3D space.

The pixels 36 may be arranged as an array, e.g., a 2-dimensional (2D) or a 1-dimensional (1D) arrangement of components. A 2D array of pixels 36 includes a plurality of pixels 36 arranged in columns and rows.

The photodetector 14 may be an avalanche-type photodetector. In other words, the photodetector 14 may be operable as an avalanche photodiode (APD) and a single-photon avalanche diode (SPAD) based on the bias voltage applied to the photodetector 14. When operated as an APD, the photodetector 14 is an analog device that outputs an analog signal. To function as the APD, the photodetector 14 may be biased at relatively high bias voltage that approaches, but is less than the breakdown voltage, of the semiconductor. Accordingly, the APD is a linear amplifier for the input signal with limited gain, e.g., a current that is proportional to the light intensity incident on the APD. To function as the SPAD, the photodetector 14 operates at a bias voltage above the breakdown voltage of the semiconductor, i.e., in Geiger mode. Accordingly, a single photon can trigger a self-sustaining avalanche with the leading edge of the avalanche indicating the arrival time of the detected photon. In other words, the SPAD is a triggering device.

The power-supply circuit 40 supplies power to the photodetector 14. The power-supply circuit 40 may include active electrical components such as MOSFET (Metal-Oxide-Semiconductor Field-Effect Transistor), BiCMOS (Bipolar CMOS), etc., and passive components such as resistors, capacitors, etc. The power-supply circuit 40 may include a power-supply control circuit. The power-supply control circuit may include electrical components such as a transistor, logical components, etc. The power-supply control circuit may control the power-supply circuit 40, e.g., in response to a command from the computer 16, to apply bias voltage (and quench and reset the photodetectors 14 in the event the photodetector 14 is operated as a SPAD).

Data output from the ROIC 38 may be stored in memory, e.g., for processing by the computer 16. The memory may be DRAM (Dynamic Random Access Memory), SRAM (Static Random Access Memory), and/or MRAM (Magneto-resistive Random Access Memory) electrically connected to the ROIC 38.

As set forth above, in examples in which the photodetector 14 operates as a SPAD, the SPAD operates in Geiger mode. "Geiger mode" means that the SPAD is operated above the breakdown voltage of the semiconductor and a single electron-hole pair (generated by absorption of one photon) can trigger a strong avalanche. The SPAD may be biased above its zero-frequency breakdown voltage to produce an average internal gain on the order of one million. Under such conditions, a readily-detectable avalanche current can be produced in response to a single input photon, thereby allowing the SPAD to be utilized to detect individual photons. "Avalanche breakdown" is a phenomenon that can occur in both insulating and semiconducting materials. It is a form of electric current multiplication that can allow very large currents within materials which are otherwise good insulators. It is a type of electron avalanche. In the present context, "gain" is a measure of an ability of a two-port circuit, e.g., the SPAD, to increase power or amplitude of a signal from the input to the output port.

When the SPAD is triggered in a Geiger-mode in response to a single input photon, the avalanche current continues as long as the bias voltage remains above the breakdown voltage of the SPAD. Thus, in order to detect the next photon, the avalanche current must be "quenched" and the SPAD must be reset. Quenching the avalanche current and resetting the SPAD involves a two-step process: (i) the bias voltage is reduced below the SPAD breakdown voltage to quench the avalanche current as rapidly as possible, and (ii) the SPAD bias is then raised by the power-supply circuit 40 to a voltage above the SPAD breakdown voltage so that the next photon can be detected.

Quenching is performed using, e.g., a quenching circuit or the like, e.g., using known techniques. Quenching is performed by sensing a leading edge of the avalanche current, generating a standard output pulse synchronous with the avalanche build-up, quenching the avalanche by lowering the bias down to the breakdown voltage and resetting the SPAD to the operative level.

Quenching may be passive or active quenching. A passive quenching circuit typically includes a single resistor in series with the SPAD. The avalanche current self-quenches because it develops a voltage drop across a resistor, e.g., 0 kΩ (Kilo Ohm) or more. After the quenching of the avalanche current, the SPAD bias voltage recovers and therefore will be ready to detect the next photon. An active circuit element can be used for resetting while performing a passive quench active reset (PQAR).

In an active quenching, upon measuring an onset of the avalanche current across a resistor, e.g., 50Ω, a digital output pulse, synchronous with the photon arrival time is generated. The quenching circuit then quickly reduces the bias voltage to below breakdown voltage, then returns bias voltage to above the breakdown voltage ready to sense the next photon. This mode is called active quench active reset (AQAR), however, depending on circuit requirements, active quenching passive reset (AQPR) may be provided. AQAR circuit typically allows lower dead times (times in which a photon cannot be detected) and reduces dead time compare to circuits having passive quenching and/or passive resetting.

The computer 16 of the Lidar system 10 is a microprocessor-based controller implemented via circuits, chips, or other electronic components. The computer 16 is in electronic communication with the pixels 36 (e.g., with the ROIC 38 and power-supply circuits 40) and the vehicle 18 (e.g., with the ADAS 20) to receive data and transmit commands. The computer 16 includes a processor and a memory. The computer 16 of the vehicle 18 may be programmed to execute operations disclosed herein. Specifically, the memory stores instructions executable by the processor to execute the operations disclosed herein as well as for electronically storing data and/or databases. The memory includes one or more forms of computer-readable media, and stores instructions executable by the computer 16 for performing various operations, including as disclosed herein. For example, the computer 16 may include a dedicated electronic circuit including an ASIC (Application Specific Integrated Circuit) that is manufactured for a particular operation, e.g., calculating a histogram of data received from the Lidar system 10 and/or generating a 3D environmental map for a Field of View (FOV) of the vehicle 18. In another example, the computer 16 may include an FPGA (Field Programmable Gate Array) which is an integrated circuit manufactured to be configurable by a customer. As an example, a hardware description language such as VHDL (Very High Speed Integrated Circuit Hardware Description Language) is used in electronic design automation to describe digital and mixed-signal systems such as FPGA and ASIC. For example, an ASIC is manufactured based on VHDL programming provided pre-manufacturing, and logical components inside an FPGA may be configured based on VHDL programming, e.g. stored in a memory electrically connected to the FPGA circuit. In some examples, a combination of processor(s), ASIC(s), and/or FPGA circuits may be included inside a chip packaging. The computer 16 may be a set of computers communicating with one another via the communication network of the vehicle 18, e.g., a computer in the Lidar system 10 and a second computer in another location in the vehicle 18.

The computer 16 may operate the vehicle 18 in an autonomous, a semi-autonomous mode, or a non-autonomous (or manual) mode. For purposes of this disclosure, an autonomous mode is defined as one in which each of vehicle 18 propulsion, braking, and steering are controlled by the computer 16; in a semi-autonomous mode the computer 16 controls one or two of vehicle 18 propulsion, braking, and steering; in a non-autonomous mode a human operator controls each of vehicle 18 propulsion, braking, and steering.

The computer 16 may include programming to operate one or more of vehicle 18 brakes, propulsion (e.g., control of acceleration in the vehicle 18 by controlling one or more of an internal combustion engine, electric motor, hybrid engine, etc.), steering, climate control, interior and/or exterior lights, etc., as well as to determine whether and when the computer 16, as opposed to a human operator, is to control such operations. Additionally, the computer 16 may be programmed to determine whether and when a human operator is to control such operations.

The computer 16 may include or be communicatively coupled to, e.g., via a vehicle communication bus, more than one processor, e.g., controllers or the like included in the vehicle 18 for monitoring and/or controlling various vehicle controllers, e.g., a powertrain controller, a brake controller, a steering controller, etc. The computer 16 is generally arranged for communications on a vehicle communication network that can include a bus in the vehicle 18 such as a controller area network (CAN) or the like, and/or other wired and/or wireless mechanisms.

The computer 16 is programmed to instruct the light emitter 12 to emit a shot of pulsed light. The computer 16 operates the array of photodetectors 14 differently after the initiation of the shot. Specifically, the computer 16 adjusts the bias voltage to one or more photodetectors 14 of the array of photodetectors 14 after the initiation of the light emitter 12 to emit the shot. The computer 16 may actuate the light emitter 12 by transmitting a command to the light emitter 12 specifying such actuation. The command may specify a light intensity for the shot. The computer 16 may identify a time at which the shot is emitted, e.g., based on an internal reference clock, and store such time in memory. The computer 16 may identify the time at which the shot is emitted as an initial time.

The computer 16 is programmed to provide bias voltages to the photodetectors 14 of the array of photodetectors 14. The computer 16 may provide the bias voltage to the photodetectors 14 upon actuating the light emitter 12. The computer 16 may initially provide the bias voltage, e.g., at the initial time of light emission.

As set forth above, the computer 16 may increase the bias voltage as a function of an amount of time lapsed since actuating the light emitter 12. Specifically, the computer 16 may initially provide the bias voltage less than the breakdown voltage of the photodetector 14 and increase the bias voltage above the breakdown voltage of the photodetector 14. As described further below, the increase in bias voltage may be a linear increase or a step-wise increase as shown in the examples in the FIG. 6. As another example, the increase may be a curved increase or any other suitable type of increase.

The bias voltage less than the breakdown voltage provides detection of emitted light with minimal background optical noise. In other words, the relatively low gain, if any, from having the bias voltage below the breakdown voltage does not significantly amplify the background optical noise. For example, the bias voltage below the breakdown voltage may provide detection of the light indicated at the peak P1, e.g., without increasing background noise.

Increasing the bias voltage increases the probability of detecting reflected light from the shots, e.g., by increasing gain, while concurrently reducing the need to quench and reset the photodetector 14. The computer 16 may increase the bias voltage to a voltage that is above the breakdown voltage within a threshold amount of time lapsing since actuating the light emitter 12. The bias voltage greater than the breakdown voltage enables detection of objects at relative farther distances, e.g., that would unlikely be detected below the breakdown voltage. For example, the increase voltage may provide increased sensitivity (e.g., compared to the first bias voltage) for detection of the light indicated at the peak P2 which is relatively less likely to be detected (e.g., compared to the light indicated at the peak P1). Further increasing voltage may provide further increased sensitivity (e.g., compared to the second bias voltage) for detection of the light indicated at the peak P3 which is relatively less likely to be detected (e.g., compared to the light indicated at the peak P2).

For example, and with reference to FIG. 6, bars D1 indicate detection by a photodetector 24 provided with a bias voltage that is below the break down voltage of the reflected light and indicated by the left most peak P1. The bars D1 correspond to the shape of the peak P1, i.e., with the tallest bar D1 aligning temporally with the apex of the peak P1. The photodetector 24 provided with below breakdown bias voltage may not detect the light indicated by the center and right peaks P2, P3 (the sensitivity may be insufficient). Bars D2 indicate detection by the photodetector 24 provided with low excess bias voltage (e.g., 1 volt over the breakdown voltage) of the reflected light and indicated by the center peak P2. The bars D2 correspond to the shape of the peak P2. The photodetector 24 provided with low excess breakdown bias voltage may not detect the light indicated by the right peak P3. Bars D3 indicate detection by the photodetector 24 provided with high excess bias voltage (e.g., 2 volts over the breakdown voltage) of the reflected light and indicated by the right peak P3. The bars D3 correspond to the shape of the peak P3.

The computer 16 may provide the bias voltages by sending a command to the power-supply circuit 40, e.g., specifying the bias voltage. The computer 16 may provide the bias voltages according to a voltage function and an amount of time lapsed since outputting the shot of pulsed light. The voltage function outputs voltage based on an input time. The function may be predetermined and stored in memory of the computer 16, for example, as an equation, a look-up, or the like, including a combination thereof.

The function may specify a continuous function between time and voltage. For example, the function may specify a linear relationship between time and voltage. An example linear relationship is illustrated by line FT1 in FIG. 6. The example linear relationship may be specified by, for example, Equation One below:

$$V = C_1 T \qquad \text{Equation One.}$$

In Equation One, the variable "T" is an amount of time lapsed since emitting light and the variable "V" is the voltage. The variable $C_1$ is a constant that may be predetermined and stored in memory, e.g., based on empirical testing, computer 16 modeling, etc., of the photodetector 14 detecting emitted light reflected at varying intensities from various distances to provide reliable detection and to minimize deadtime of the photodetector 14. The continuous function may specify other relationships between time and voltage, e.g., exponential, logarithmic, etc., including a combination thereof.

The function may specify a step-wise function between time and voltage. For example, the function may specify ranges of times associated with voltages. An example exponential relationship is illustrated by line FT2 in FIG. 6. An example look-up table is provided below:

| Time Range | Voltage |
|---|---|
| $T_i$-$T_1$ | $V_A$ |
| $T_1$-$T_2$ | $V_B$ |
| $T_2$-$T_3$ | $V_C$ |

In Table One, the variable $T_i$ indicates the initial time, i.e., the time at which the light emitter 12 emits a shot of pulsed light. The variables $T_1$, $T_2$, and $T_3$ specify amounts of time after the initial time, e.g., 7 nanoseconds, 70 nanoseconds, and 150 nanoseconds, respectively.

The variables $V_A$, $V_B$, and $V_C$, indicate various bias voltages to provide the photodetectors 14. For example, the voltage $V_A$ may be less than the breakdown voltage for the photodetectors 14, e.g., 1 volt below the bias voltage. The voltage $V_B$ may be at or generally close to the breakdown voltage, e.g., less than or equal to 1 volt of excess voltage. The voltage $V_C$ may be greater than the breakdown voltage, e.g., at least 2 volts greater than the breakdown voltage. In other words, the voltage $V_C$ may operate the photodetector 14 in Geiger mode.

The time ranges $T_i$-$T_1$, $T_1$-$T_2$, $T_2$-$T_3$ and the voltages $V_A$, $V_B$, and $V_C$, may be determined based on desired ranges of detection, e.g., by calculating an amount of a time taken by emitted light to reflect back to the Lidar system 10, e.g., times of flight. The time ranges $T_i$-$T_1$, $T_1$-$T_2$, $T_2$-$T_3$ and the voltages $V_A$, $V_B$, and $V_C$, may be determined based on intensities of emitted light reflected from various distances and performance characteristics of the photodetectors 14, e.g., to provide reliable detection and to minimize deadtime of the photodetector 14.

The computer 16 is programmed to compile a histogram (e.g., that may be used to generate the 3D environmental map) based on detected shots, e.g., detected by the photodetectors 14 and received from the ROICs 38. The histogram indicates an amount and/or frequency at which light is detected from different reflection distances, i.e., having different times of flights. The computer 16 may weigh the detected light represented in the histogram based on the bias voltage provided to the photodetector 14 detecting such light. For example, the computer 16 may increase a bin of the histogram associated with a certain reflection distance by a value of one when the photodetector 14 is provided with a bias voltage that is above the breakdown voltage. The computer 16 may increase a bin of the histogram associated with a certain reflection distance by a value of four when the photodetector 14 is provided with a bias voltage that is generally at the breakdown voltage. The computer 16 may increase a bin of the histogram associated with a certain reflection distance by a value of eight when the photodetector 14 is provided with a bias voltage that is below the breakdown voltage. As another example, the computer 16 may store an equation, a lookup table, or the like, associating various weights with various bias voltages. The computer 16 may compile the histogram based on the light detected with the photodetectors 14 and weighted as specified by the look up table and based on the bias voltage provided to the photodetectors 14. When increasing the counts of the various bins, the computer weights such increase based on the bias voltage at the time of detection. For example, the bin B3 may be increased by a value of eight when the bias voltage is below the breakdown voltage upon light detection, and may increase the bin B3 by a value of four when the bias voltage that is generally at the breakdown voltage.

Figure 7:
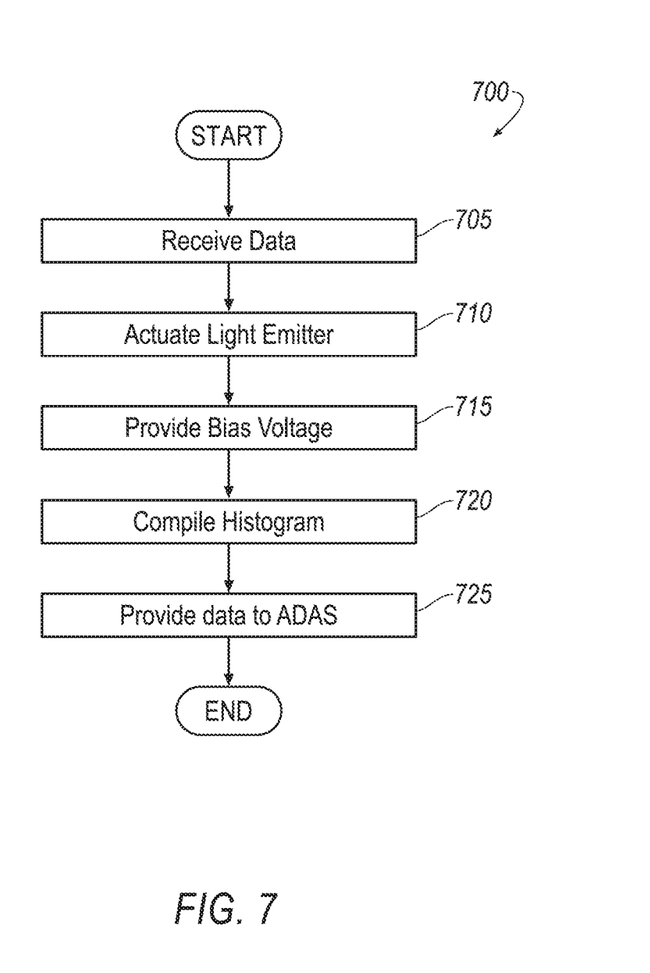
FIG. 7 is a flow chart illustrating a process for controlling the Lidar system.

FIG. 7 is a process flow diagram illustrating an exemplary process 700 for controlling the Lidar system 10. The process 700 begins in a block 705. At the block 705 the computer 16 receives data, e.g., from the photodetectors 14 via the ROICs 38. The computer 16 may store the received data, e.g., in memory. The computer 16 may receive data substantially continuously and throughout the process 700.

At a block 710 the computer 16 actuates the light emitter 12 to provide a shot of pulsed light. The computer 16 may actuate the light emitter 12 by sending one or more commands to the light emitter 12.

Next, at a block 715 the computer 16 provides bias voltages to one or more of the photodetectors 14, e.g., by sending a command to the power-supply circuits 40 of the respective photodetectors 14. The computer 16 initially provides the bias voltage at a voltage below the breakdown voltage of the photodetectors 14. The computer 16 then increases the bias voltage as a function of time lapsed since actuating the light emitter 12 at the block 710, e.g., according to a voltage function and as described herein. The computer 16 may continuously increase the bias voltage, e.g., linearly. The computer 16 may increase the bias voltage as a step-wise function, e.g., based on a look-up table associating time ranges with voltages and as described herein.

At a block 720 the computer 16 detects the shot emitted at the block 710 and compiles a histogram based on shots of the series detected by the photodetectors 14. The computer 16 may weight values of the detected shot in the histogram based on the bias voltage provided to the photodetector 14 at a time of such detection, e.g., as described herein.

At a block 725 the computer 16 provides data to the ADAS 20, e.g., data specifying a 3D environmental map that is based on the detected shots and/or the histogram. After the block 725 the process 700 may end. Alternately, the computer 16 may return the block 710 and iteratively perform the process 700. Upon returning to the block 710 the computer 16 may actuate the light emitter 12 to provide a second shot or pulsed light at a same light intensity as emitted in at the block 710 in the initial and/or other previous iterations of the process 700.

With regard to the process 700 described herein, it should be understood that, although the steps of such process have been described as occurring according to a certain ordered sequence, such process could be practiced with the described steps performed in an order other than the order described herein. It further should be understood that certain steps could be performed simultaneously, that other steps could be added, or that certain steps described herein could be omitted. In other words, the description of the process herein is provided for the purpose of illustrating certain embodiments and should in no way be construed so as to limit the disclosed subject matter.

Use of "in response to" and "upon determining" indicates a causal relationship, not merely a temporal relationship.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A Lidar system, comprising:
   a light emitter;
   an array of photodetectors;
   a computer having a processor and a memory storing instructions executable by the processor to:
      actuate the light emitter to output a shot;
      provide a bias voltage to one or more of the photodetectors after actuating the light emitter; and
      increase the bias voltage as a function of time lapsed since actuating the light emitter.

2. The Lidar system of claim 1, wherein the photodetectors are avalanche-type photodetectors.

3. The Lidar system of claim 2, wherein the instructions include instructions to provide the bias voltage at a voltage that is initially less than a breakdown voltage of the photodetectors.

4. The Lidar system of claim 3, wherein the instructions include instructions to increase the bias voltage to a voltage to above the breakdown voltage within a threshold amount of time lapsing since actuating the light emitter.

5. The system of claim 1, wherein the instructions include instructions to continuously increase the bias voltage.

6. The system of claim 1, wherein the instructions include instructions to increase the bias voltage as a step-wise function.

7. The Lidar system of claim 1, wherein the instructions include instructions to weight values of detected light based on bias voltage provided to the photodetector when the light is detected, and to compile a histogram based on the weighted values.

8. The Lidar system of claim 1, wherein the instructions include instructions to actuate the light emitter to output a second shot after detecting the shot, to provide a second bias voltage to one or more of the photodetectors after actuating the light emitter to output the second shot, and to increase the second bias voltage as a function of time lapsed since actuating the light emitter to output the second shot.

9. The Lidar system of claim 8, wherein the instructions includes instructions to actuate the light emitter to output the shot and the second shot at a same intensity.

10. A system, comprising a non-transitory computer having a processor and a memory storing instructions executable by the processor to:
    actuate a light emitter to output a shot;
    provide a bias voltage to an array of photodetectors upon actuating the light emitter; and
    increase the bias voltage as a function of an amount of time lapsed since actuating the light emitter.

11. The system of claim 10, wherein the photodetectors are avalanche-type photodetectors.

12. The system of claim 11, wherein the instructions include instructions to provide the bias voltage at a voltage that is initially less than a breakdown voltage of the photodetectors.

13. The system of claim 12, wherein the instructions include instructions to increase the bias voltage to a voltage that is above the breakdown voltage within a threshold amount of time lapsing since actuating the light emitter.

14. The system of claim 10, wherein the instructions include instructions to continuously increase the bias voltage.

15. The system of claim 10, wherein the instructions include instructions to increase the bias voltage as a step-wise function.

16. The system of claim 10, wherein the instructions include instructions to weight values of detected light based on bias voltage provided to the photodetector when the light is detected, and to compile a histogram based on the weighted values.

17. The system of claim 10, wherein the instructions include instructions to actuate the light emitter to output a second shot after detecting the shot, to provide a second bias voltage to one or more of the photodetectors after actuating the light emitter to output the second shot, and to increase the second bias voltage as a function of time lapsed since actuating the light emitter to output the second shot.

18. The system of claim 10, wherein the instructions includes instructions to actuate the light emitter to output the shot and the second shot at a same intensity.

* * * * *